(12) United States Patent
Hu et al.

(10) Patent No.: US 9,594,280 B2
(45) Date of Patent: Mar. 14, 2017

(54) THIN FILM TRANSISTOR ARRAY SUBSTRATE, DISPLAY DEVICE AND METHOD

(71) Applicants: CHENGDU BOE OPTOELECTRONICS TECHNOLOGY CO., LTD., Chengdu, Sichuan Province (CN); BOE TECHNOLOGY GROUP CO., LTD., Beijing (CN)

(72) Inventors: Wei Hu, Beijing (CN); Zailong Mo, Beijing (CN); Tianlei Shi, Beijing (CN)

(73) Assignees: CHENGDU BOE OPTOELECTRONICS TECHNOLOGY CO., LTD., Chengdu, Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 214 days.

(21) Appl. No.: 14/348,744

(22) PCT Filed: Jun. 13, 2013

(86) PCT No.: PCT/CN2013/077174
§ 371 (c)(1),
(2) Date: Mar. 31, 2014

(87) PCT Pub. No.: WO2014/139230
PCT Pub. Date: Sep. 18, 2014

(65) Prior Publication Data
US 2015/0301414 A1    Oct. 22, 2015

(30) Foreign Application Priority Data
Mar. 13, 2013   (CN) .......................... 2013 1 0080482

(51) Int. Cl.
*G02F 1/1362* (2006.01)
*H01L 27/12* (2006.01)
(Continued)

(52) U.S. Cl.
CPC ...... *G02F 1/134363* (2013.01); *G02F 1/1362* (2013.01); *G02F 1/1368* (2013.01);
(Continued)

(58) Field of Classification Search
CPC ............. H01L 51/5109; H01L 51/5224; H01L 51/5281; H01L 51/5209; H01L 51/5225;
(Continued)

(56) References Cited

U.S. PATENT DOCUMENTS 9,482,919 B2 * 11/2016 Shishido ........... G02F 1/136286
2004/0212768 A1 * 10/2004 Wu ................... G02F 1/134363
349/141
(Continued)

FOREIGN PATENT DOCUMENTS

CN    102629040 A    8/2012
CN    103149764 A    6/2013
(Continued)

OTHER PUBLICATIONS

Chinese Rejection Decision Appln. No. 201310080482.1; Dated Jul. 23, 2015.
(Continued)

*Primary Examiner* — Cheung Lee
*Assistant Examiner* — Stephen C Smith
(74) *Attorney, Agent, or Firm* — Ladas & Parry LLP

(57) ABSTRACT

A thin film transistor array substrate includes a base substrate and a thin film transistor, a second insulation layer, a first electrode and a second electrode formed on the base substrate. The first electrode and the second electrode are used to form an electric field, and the second insulation layer
(Continued)

is interposed between the first electrode and the second electrode. The second electrode is a comb-like electrode, and located at a side of the second insulation layer away from the base substrate. The array substrate further includes protrusion structure located at a side of the first electrode close to the base substrate, the position of the protrusion structure corresponds to the slit portions of the comb-like electrode. A manufacturing method of a thin film transistor array substrate and a display device are further provided.

17 Claims, 2 Drawing Sheets

(51) Int. Cl.
    *H01L 29/66*     (2006.01)
    *G02F 1/1343*     (2006.01)
    *G02F 1/1337*     (2006.01)
    *G02F 1/1339*     (2006.01)
    *G02F 1/1333*     (2006.01)
    *G02F 1/1368*     (2006.01)
    *H01L 29/417*     (2006.01)
    *H01L 29/423*     (2006.01)

(52) U.S. Cl.
    CPC .... *G02F 1/13394* (2013.01); *G02F 1/133345* (2013.01); *G02F 1/133707* (2013.01); *G02F 1/134336* (2013.01); *H01L 27/124* (2013.01); *H01L 27/1259* (2013.01); *H01L 29/41733* (2013.01); *H01L 29/42384* (2013.01); *G02F 2001/134318* (2013.01)

(58) Field of Classification Search
    CPC ............... H01L 27/127; H01L 27/1259; H01L 29/41733; H01L 29/42384; G02F 1/1333; G02F 1/133707; G02F 1/134363; G02F 1/1368; G02F 1/1362; G02F 1/134336; G02F 1/13394; G02F 1/133345
    See application file for complete search history.

(56) References Cited

U.S. PATENT DOCUMENTS

2008/0266480 A1* 10/2008 Lee ................... G02F 1/134309
    349/48
2014/0167274 A1     6/2014 Wang et al.

FOREIGN PATENT DOCUMENTS

JP     2009-086576 A     4/2009
JP     2010-234716 A     10/2010

OTHER PUBLICATIONS

International Preliminary Report on Patentability Appln. No. PCT/CN2013/077174; Dated Sep. 15, 2015.
First Chinese Office Action dated Dec. 16, 2014; Appln. No. 201310080482.1.
International Search Report mailed Aug. 29, 2013; PCT/CN2013/077174.
Second Chinese Office Action Appln. No. 201310080482.1; Dated Apr. 16, 2015.

* cited by examiner

THIN FILM TRANSISTOR ARRAY SUBSTRATE, DISPLAY DEVICE AND METHOD

FIELD OF THE INVENTION

The embodiments of the present invention relate to a thin film transistor array substrate, a display device and a method.

BACKGROUND

The basic structure of a thin film transistor liquid crystal display (TFT-LCD, in short) includes an array substrate and a color filter substrate (CF substrate) with a liquid crystal layer filled therebetween. On the surfaces of the array substrate and the color filter substrate, a polyimide film layer (alignment layer) (PI film) is provided for aligning the liquid crystal. The array substrate includes a gate electrode, a gate insulation layer, an active layer, a source electrode and a drain electrode. In the conventional display substrate manufacturing technology, on the array substrate, the gate electrode, the gate insulation layer, the active layer, the pixel electrode, the source/drain electrode, a second insulation layer, and a common electrode are sequentially deposited to form an thin film transistor structure, and by controlling the potential difference formed between the pixel electrode and the common electrode, horizontal field driving can be achieved.

For the conventional display substrate manufacturing technology, a first transparent conductive film is used as the pixel electrode, and a comb-like second transparent conductive film is used as the common electrode, gaps are formed between each of slits of the comb-like second conductive film. Under the co-effect of the left and right stripe electrode, the above mentioned horizontal field will become relative small in the middle area of the gap, the longitudinal noise field becomes larger, and the alignment function of the horizontal field becomes weak, press in the white state picture causes the deflection of the liquid crystal disorder, and the relative weak horizontal field in the middle area of the gap cannot restore the liquid crystal to the state before press, that is, resulting in the occurrence of Trace Mura. As the high pixel density of the panel is increasingly high, the width of the stripe of the second conductive film is made narrower and narrower, and in the case that the width of the gap is not significantly varied, the problem becomes serious.

SUMMARY

One of the technical problem to be solved by the present invention is to provide an array substrate structure, a liquid crystal panel and a display device by which the occurrence of the Trace Mura in the conventional display substrate manufacturing technology is avoid.

According to one embodiment of the present invention, a thin film transistor array substrate is provided, which includes a base substrate, and a film transistor, a second insulation layer, a first electrode and a second electrode formed on the base substrate;

Wherein the first electrode and the second electrode are used for forming electric field; the second insulation layer is interposed between the first electrode and the second electrode;

The second electrode is comb-like electrode, and located on a side of the second insulation layer away from the base substrate, the comb-like electrode includes a plurality of slit portions and stripe electrode portions arranged alternately;

The array substrate further includes a protrusion structure located on a side of the first electrode close to the base substrate, and the position of the protrusion structure corresponds to the slit portions of the comb-like electrode.

In one example, the protruding shape of the protrusion structure is prism shaped.

In one example, the extending direction of the prism shape is parallel with the extending direction of the slits, and the largest width of the cross section of the prism parallel with the surface of the base substrate is smaller than the width of the slit portion of the comb-like electrode.

In one example, the protrusion structure includes a first electrode layer protrusion which is formed with the first electrode simultaneously.

In one example, the protrusion structure includes a gate electrode layer protrusion which is formed with the gate electrode of the thin film transistor simultaneously.

In one example, the protrusion structure includes a gate insulation layer protrusion which is formed with the gate insulation layer simultaneously.

In one example, the protrusion structure is a transparent block provided between the first electrode and the base substrate.

In one example, the protrusion structure is provided between the first electrode and the gate insulation layer of the thin film transistor, or between the gate insulation layer and the base substrate.

In one example, the transparent block is a resin block.

In one example, the first electrode is contacted with the drain electrode of the thin film transistor, and the first electrode functions as the pixel electrode of the array substrate; the second electrode functions as the common electrode of the array substrate.

In one example, the first electrode functions as the common electrode of the array substrate, and the second electrode is contacted with the drain electrode of the thin film transistor through a via in the second insulation layer, and the second electrode functions as the pixel electrode of the array substrate.

In one example, the cross section of the triangular prism is an isosceles triangle shape having an apex angle of 30°~90°.

In one example, the cross section of the rectangular prism is an isosceles trapezoid having an apex angle of 105°~120°.

According to another embodiment of the present invention, there is provided a display device including an array substrate as described in any embodiment of the present invention.

According to still another embodiment of the present invention, there is provided a method for manufacturing a thin film transistor array substrate, including the steps of:

forming a first electrode, a thin film transistor, a protrusion structure and a second insulation layer on a base substrate;

providing a second electrode above the second insulation layer;

wherein the second electrode is comb-like electrode, the comb-like electrode includes a plurality of slit portions and stripe electrode portions arranged alternatively, the position of the protrusion structure corresponds to the slit portions of the comb-like electrode.

In one example, the protrusion structure includes a first electrode layer protrusion which is formed with the gate electrode of the thin film transistor simultaneously.

In one example, the protrusion structure includes gate electrode layer protrusion which is formed with the gate electrode of the thin film transistor simultaneously.

In one example, the protruding shape of the protrusion structure is prism shape. According to the present invention, in addition to the conventional TFT-LCD array substrate, a resin block is added between the pixel electrode layer and the first insulation layer, and the resin block is provided with a protrusion portion thereon; the shape of pixel electrode layer corresponds to the shape of the protrusion portion; the upper end of the protrusion portion is correspondingly provided between two adjacent comment electrodes. In the present invention, by changing the shape of the pixel electrode layer through the resin block, the size of the horizontal field weaken area between the common electrodes are effectively narrowed, and the longitudinal noise field is reduced, without changing the thickness of the pixel electrode layer, so that the ability of the horizontal field for aligning the liquid crystal is enhanced, the occurrence of the Trace Mura is suppressed, and the quality of the display device is improved, and thus the display effect of the high pixel density panel is guaranteed.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1:
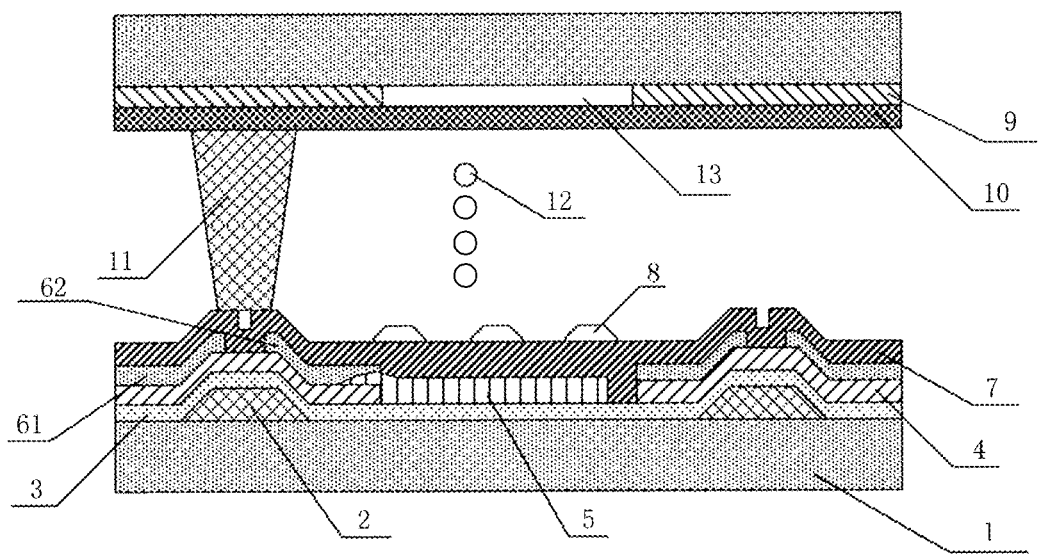
FIG. 1 is a schematic side view of LCD by the conventional display substrate manufacturing technology.

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

In order to avoid the occurrence of the Trace Mura as in the conventional display substrate manufacturing technology, according to the embodiment of the present invention, a thin film transistor array substrate is provided.

The embodiment of the present invention provides a thin film transistor array substrate which includes: a base substrate and a thin film transistor, a second insulation layer, a first electrode and a second electrode formed on the base substrate.

The first electrode and the second electrode are used to form electric field, and the second insulation layer is interposed between the first electrode and the second electrode;

The second electrode is a comb-like electrode and located at a side of the second insulation layer away from the base substrate.

The array substrate further includes a protrusion structure located at a side of the first electrode close to the base substrate, and the position of the protrusion structure corresponds to the gap between the comb-like electrodes.

In this embodiment, by providing the protrusion structure, the size of the horizontal field weaken area is effectively narrowed, and the longitudinal noise field is reduced, so that the ability of the horizontal field for aligning the liquid crystal is enhanced, the occurrence of the Trace Mura is suppressed, and the quality of the display device is improved, and thus the display effect of the high pixel density panel is guaranteed.

For example, the array substrate as provided in the present embodiment may further include one or more of the following features:

The protrusion shape of the protrusion structure is prism shape, the edge of the prism is directed toward the gap. Of course, the protrusion structure could be any other shape which has balance and regulation function on the weakened electric field, such as upward directed pyramid shape, but the present invention is not limited thereto.

The prism shape may be triangular prism or rectangular prism, and the apex angle of the triangular prism is within 0° to 180°, and preferably 30° to 90°. The apex angle of the rectangular prism is within 90° to 180° and preferably 105° to 120°. The width of the bottom side of the triangular prism or rectangular prism is smaller than the width of the gap of the comb-like electrode.

The comb-like electrode is a plurality of stripe electrode arranged parallel, and the stripe electrode may be straight linear stripe, and also may be angled stripe, the present invention is not limited thereto.

The protrusion structure includes a first electrode layer protrusion which is formed with the first electrode simultaneously. That is to say, the first electrode layer protrusion is integrally formed with the first electrode, and has the same material as the first electrode, is referred to as first electrode layer protrusion here.

The protrusion structure includes a gate electrode layer protrusion which is formed with the gate electrode layer of the thin film transistor simultaneously.

The protrusion structure includes a gate insulation layer protrusion which is formed with the gate insulation layer of the thin film transistor simultaneously.

The protrusion structure may also be a transparent block which is separately provided between any two layers between the first electrode and the base substrate, and is not formed simultaneously with any other layer. That is, the protrusion structure is provided between the first electrode and the gate insulation layer of the thin film transistor, or is provided between the gate insulation layer and the base substrate.

The transparent block, for example, is a resin material block.

The first electrode is contacted with the drain electrode of the thin film transistor, and the first electrode functions as a pixel electrode of the array substrate; the second electrode functions as a common electrode of the array substrate.

Alternatively, the first electrode functions as a common electrode of the array substrate, and the second electrode is contacted with the drain electrode of the thin film transistor through vias on the second insulation layer, and the electrode functions as a pixel electrode of the array substrate.

For example, the cross section of the triangular prism is an isosceles triangle.

For example, the cross section of the rectangular prism is an isosceles trapezoid.

The embodiment of the present invention further provides a display device including the above mentioned array substrate.

The embodiment of the present invention further provides a method for manufacturing a thin film transistor array substrate, the method includes the steps of follows:

Forming a first electrode, a thin film transistor, a protrusion structure and a second insulation layer on the base substrate;

Providing a second electrode above the second insulation layer;

Wherein the second electrode is a comb-like electrode and the position of the protrusion structure corresponds to the gap between the comb-like electrodes.

In this embodiment, by providing the protrusion structure, the size of the horizontal field weaken area is effectively narrowed, and the longitudinal noise field is reduced, so that the ability of the horizontal field for aligning the liquid crystal is enhanced, the occurrence of the Trace Mura is suppressed, and the quality of the display device is improved, and thus the display effect of the high pixel density panel is guaranteed.

For example, the present embodiment may further include one or more of the following features:

The protrusion structure includes a first electrode layer protrusion which is formed simultaneously with the first electrode.

The protrusion structure includes a gate electrode layer protrusion which is formed simultaneously with the gate electrode of the thin film transistor.

The protrusion shape of the protrusion structure is a prism shape.

In the conventional display substrate manufacturing technology, a first electrode 2, a first insulation layer 3, an active layer 4, a pixel electrode layer 5, a source electrode 61, a drain electrode 62, a second insulation layer 7, a common electrode 8 are sequentially deposited on the base substrate 1 to form a TFT structure. A black matrix 9, a R/G/B resin 13, an overcoat layer 10 and PS resin 11 are sequentially deposited on a substrate to form a color filter substrate.

In the embodiment of the present invention, the resin block 14 is formed into a triangular prism shape, and a triangular prism shaped protrusion pixel electrode layer 5 is formed on the resin block 14, which effectively reduces the size of the horizontal field weaken area in the gap, suppresses the occurrence of the Trace Mura, and thus improve the quality of the display device.

FIG. 1 is a cross-sectional view of a TFT-LCD according to the conventional display substrate manufacturing technology. The array substrate structure includes a base substrate 1, a first electrode 2, a gate insulation layer 3, an active layer 4, a pixel electrode layer 5, a source/drain electrode 6, a second insulation layer 7, a common electrode layer 8. The color filter substrate structure includes a glass substrate, a black matrix 9, a R/G/B resin 13, an overcoat layer 10, a PS resin 11. The TFT-LCD structure further includes a liquid crystal layer 12 in the cell, a PI layer for aligning the liquid crystal, and a sealant for connecting the array substrate and the color filter substrate.

Figure 2:
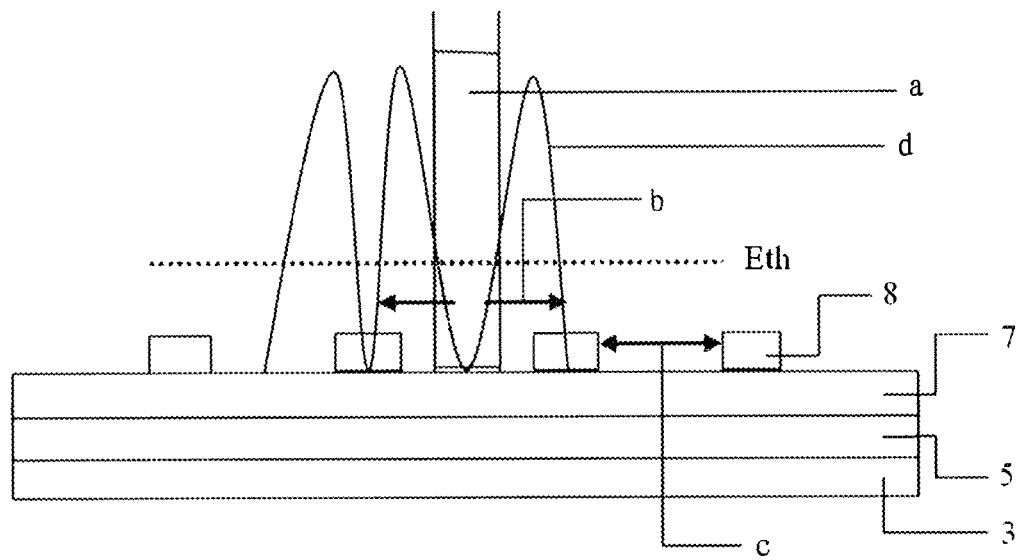
FIG. 2 is a schematic view illustrating the horizontal field in each of the gaps according to the conventional display substrate manufacturing technology.

FIG. 2 is a schematic view illustrating the horizontal electric field in each of the slits in the pixel electrode and the common electrode according to the conventional display substrate manufacturing technology. The pixel electrode is designed as matrix planer structure, and the common electrode is designed as comb-like planer structure. By controlling the potential difference between the pixel electrode and the common electrode, a horizontal electric field d is formed, strength of which is periodically laterally varied. In FIG. 2, b indicates a direction opposite to the direction of the horizontal field. The electric field at the opposite sides of the gap c between the respective slits has opposite direction, and thus the horizontal field in the middle area of gap is weakened. The Trace Mura is likely to be occurred in the area a where the horizontal field is less than a certain limit Eth.

Figure 3:
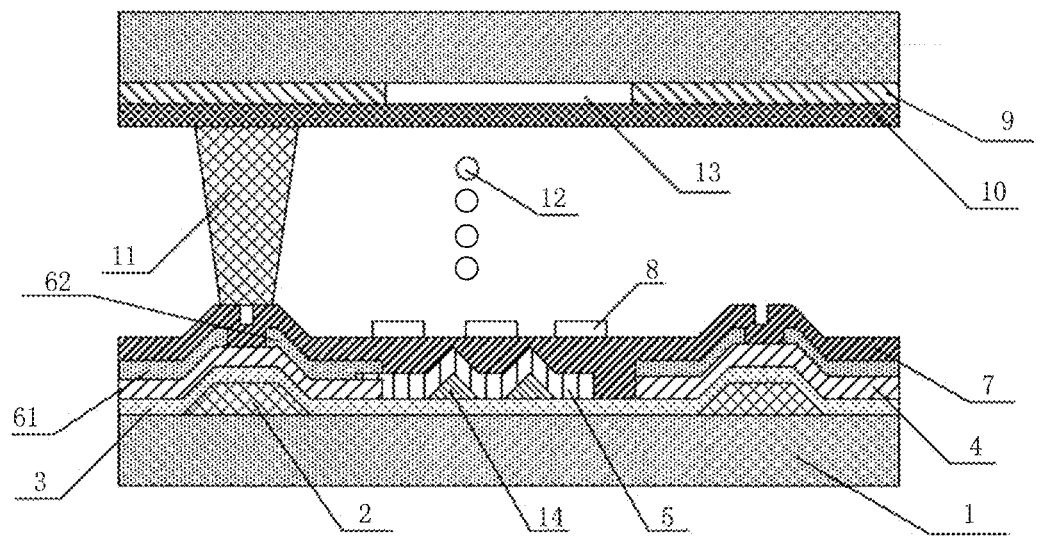
FIG. 3 is a schematic side view of LCD according to an embodiment of the present invention.

FIG. 3 is a cross sectional view of a LCD according to the embodiment of the present invention. The array substrate structure includes a base substrate 1, a first electrode 1, a gate insulation layer 3, an active layer 4, a resin layer 14 in triangular prism shape or rectangular prism shape whose cross section is an isosceles trapezoid, a pixel electrode layer 5, a source/drain electrode layer 6, a second insulation layer 7, and a common electrode layer 8. The maximum thickness of the resin layer is 1 μm~4 μm. The cross section of the triangular prism is an isosceles triangle, and one edge of the prism is directed to light exit side of the substrate. The cross section of the rectangular prism shaped resin layer is a isosceles trapezoid, and the width of the upper base of the trapezoid is smaller than the lower base, and the width of the upper base is 0 μm~4 μm. It is preferred that the width of the upper base of the isosceles trapezoid is as small as possible, and the pixel electrode at both sides of the resin layer renders a slope structure, and the angle formed between the slope of the pixel electrode and the glass substrate is 15°~90°. For example, the common electrode layer 8 is a comb-like electrode, and the comb-like electrode includes a plurality of slit portions and stripe electrode portions arranged alternately. For example, the extending direction of the prism shape is parallel with the extending direction of the slit.

For example, the width of the base side of the triangle or trapezoid is smaller than the width of the gap, but the present invention is not limited thereto. For example, the maximum width of the cross section of the prism along the direction parallel with the surface of the base substrate is smaller than the width of the slit portion of the comb-like electrode.

Figure 4:
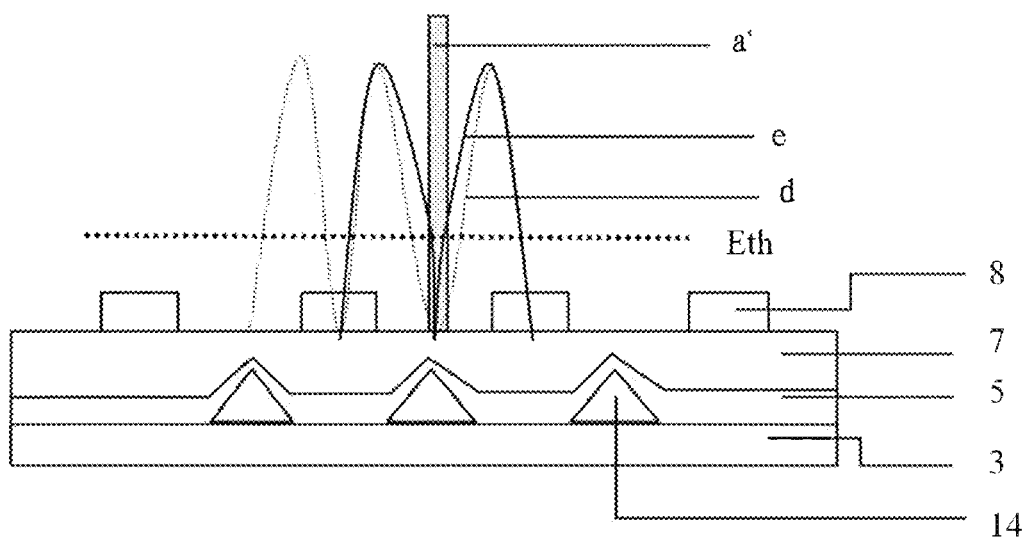
FIG. 4 is a schematic view illustrating the horizontal field in each of the gaps according to the embodiment of the present invention.

FIG. 4 is a schematic view illustrating the horizontal electric field in the respective gaps in the common electrode and the pixel electrode according to the embodiment of the present invention. The resin layer 14 on the gate insulation layer is in triangular prism shape, the pixel electrode layer is formed on the resin layer. On the resin layer, protrusions in triangular prism shape are formed. By the slope electrode design, the middle area of the gap where the horizontal electric field is below the above limit Eth is reduced from a to a'. In FIG. 4, e indicates the horizontal electric field in the TFT-LCD array substrate according to the embodiment of the present invention. Compared with the horizontal field d in the conventional horizontal field profile, the horizontal field e obtained by the embodiment of the present invention is capable of suppressing the occurrence of Trace Mura.

In the embodiment of the present invention, on the basis of the conventional TFT-LCD array substrate, a resin block, on which protrusions are provided, is added between the pixel electrode layer and the first insulation layer. The pixel electrode layer has a shape accommodating the shape of the protrusions. The upper ends of the protrusions are correspondingly provided between two adjacent comment electrodes. In the present embodiment of the present invention, by changing the shape of the pixel electrode layer by the resin block, without changing the thickness of the pixel electrode layer, the size of the horizontal field weaken area between the common electrodes are effectively narrowed, and the longitudinal noise field is reduced, so that the ability of the horizontal field for aligning the liquid crystal is enhanced, the occurrence of the Trace Mura is suppressed, and the quality of the display device is improved, and thus the display effect of the high pixel density panel is guaranteed.

In addition, the embodiment of the present invention also provides a liquid crystal panel including an array substrate structure as above described or as manufactured by the above-mentioned method for manufacturing an array substrate.

The embodiment of the present invention may also applied in a display device, the display device may be any product or component having display function, such as a liquid crystal panel, a electronic paper, a OLED panel, a liquid crystal television, a liquid crystal display, a digital photo frame, a mobile phone, a tablet computer.

What are described above is related to the illustrative embodiments of the disclosure only and not limitative to the scope of the disclosure; the scopes of the disclosure are defined by the accompanying claims.

What is claimed is:

1. A thin film transistor array substrate comprising a base substrate and a thin film transistor, a second insulation layer, a first electrode and a second electrode formed on the base substrate,
   wherein the first electrode and the second electrode are used to form an electric field, and the second insulation layer is interposed between the first electrode and the second electrode;
   the second electrode is a comb-like electrode, and located at a side of the second insulating layer away from the base substrate, the comb-like electrode includes a plurality of slit portions and stripe electrode portions arranged alternately;
   the base substrate further includes a protrusion structure located at a side of the first electrode close to the base substrate, a position of the protrusion structure corresponds to the slit portions of the comb-like electrode,
   wherein a protruding shape of the protrusion structure is a prism shape, an extending direction of the prism shape is parallel with an extending direction of the slits, and a maximum width of a cross section of the protrusion structure along a direction parallel with the surface of the base substrate is smaller than a width of the slit portions of the comb-like electrode.

2. The array substrate according to claim 1, wherein the protrusion structure includes a first electrode layer protrusion which is formed simultaneously with the first electrode.

3. The array substrate according to claim 1, wherein the protrusion structure includes a gate layer protrusion which is formed simultaneously with a gate electrode of the thin film transistor.

4. The array substrate according to claim 1, wherein the protrusion structure includes a gate insulation layer protrusion which is formed simultaneously with a gate insulation layer of the thin film transistor.

5. The array substrate according to claim 1, wherein the protrusion structure is a transparent block provided between the first electrode and the base substrate.

6. The array substrate according to claim 5, wherein the protrusion structure is provided between the first electrode and a gate insulation layer of the thin film transistor, or provided between the gate insulation layer and the base substrate.

7. The array substrate according to claim 5, wherein the transparent block is a resin material block.

8. The array substrate according to claim 1, wherein the first electrode is contacted with a drain electrode of the thin film transistor, the first electrode functions as a pixel electrode of the array substrate, and the second electrode functions as a common electrode of the array substrate.

9. The array substrate according to claim 1, wherein the first electrode functions as a common electrode of the array substrate, the second electrode is contacted with a drain electrode of the thin film transistor through a via on the second insulation layer, and the second electrode functions as a pixel electrode of the array substrate.

10. The array substrate according to claim 1, wherein the prism is a triangular prism, and a cross section of the triangular prism is an isosceles triangle having an apex angle of 30°~90°.

11. The array substrate according to claim 1, wherein the prism is a rectangular prism, and a cross section of the rectangular prism is an isosceles trapezoid having an apex angle of 105°~120°.

12. A display device including an array substrate according to claim 1.

13. A method for manufacturing a thin film transistor array substrate, comprising:
   forming a first electrode, a thin film transistor, a protrusion structure and a second insulation layer on a base substrate;
   providing a second electrode above the second insulation layer;
   wherein the second electrode is a comb-like electrode, and located at a side of the second insulating layer away from the base substrate, the comb-like electrode includes a plurality of slit portions and stripe electrode portions arranged alternately, a position of the protrusion structure corresponds to the slit portions of the comb-like electrode,
   wherein a protruding shape of the protrusion structure is a prism shape, an extending direction of the prism shape is parallel with an extending direction of the slits, and a maximum width of a cross section of the protrusion structure along a direction parallel with the surface of the base substrate is smaller than a width of the slit portions of the comb-like electrode.

14. The method according to claim 13, wherein the protrusion structure includes a first electrode layer protrusion which is formed simultaneously with the first electrode.

15. The method according to claim 13, wherein the protrusion structure includes a gate layer protrusion which is formed simultaneously with a gate electrode of the thin film transistor.

16. The array substrate according to claim 1, wherein the protrusion structure includes a first electrode layer protrusion which is formed simultaneously with the first electrode.

17. The array substrate according to claim 1, wherein the protrusion structure includes a gate layer protrusion which is formed simultaneously with a gate electrode of the thin film transistor.

* * * * *